United States Patent [19]

Grobman

[11] 4,408,338

[45] Oct. 4, 1983

[54] PULSED ELECTROMAGNETIC RADIATION SOURCE HAVING A BARRIER FOR DISCHARGED DEBRIS

[75] Inventor: Warren D. Grobman, Yorktown Heights, N.Y.

[73] Assignee: International Business Machines Corporation, Armonk, N.Y.

[21] Appl. No.: 336,468

[22] Filed: Dec. 31, 1981

[51] Int. Cl.³ .............................................. G03C 5/16
[52] U.S. Cl. .................................. 378/034; 378/119; 378/160
[58] Field of Search ................ 378/34, 119, 122, 160, 378/140; 250/504 R, 492.2; 315/111.11

[56] References Cited

U.S. PATENT DOCUMENTS 3,991,309 11/1976 Hauer .................................. 378/160
4,184,078 1/1980 Nagel et al. .......................... 378/034
4,296,330 10/1981 Thomson et al. ............... 250/504 R Primary Examiner—Alfred E. Smith
Assistant Examiner—T. N. Grigsby
Attorney, Agent, or Firm—Ronald L. Drumheller

[57] ABSTRACT

A physical barrier is provided for debris discharged from any pulsed electromagnetic radiation source. A shutter is positioned in the path of the electromagnetic radiation at a distance sufficiently far from the source of the electromagnetic radiation such that an emitted pulse of electromagnetic radiation and the debris simultaneously discharged with the pulse become spatially separated from each other and arrive at the shutter at different times due to the inherent difference in propagation speed of the debris and pulse. Movement of the shutter is synchronized with generation of an electromagnetic pulse such that the electromagnetic pulse encounters an open shutter while the slower travelling debris simultaneously launched with the pulse encounters a closed shutter.

13 Claims, 4 Drawing Figures

PULSED ELECTROMAGNETIC RADIATION SOURCE HAVING A BARRIER FOR DISCHARGED DEBRIS

DESCRIPTION

1. Field of the Invention

This invention relates to bright, pulsed sources of x-rays and ultraviolet light, particularly where the x-ray or ultraviolet light pulses arise from a hot plasma or from the impact of an energy beam with a target surface.

2. Background of the Invention

Microelectronic circuits can be fabricated by exposing thin resist films to actinic radiation through an adjacent patterned mask (proximity printing). Due to diffraction effects, the minimum line width which can be replicated by proximity printing in practice is directly proportional to the wavelength of the exposing radiation (or equivalent wavelength when the radiation is not electromagnetic radiation). Production of a line width of about 1 μm requires ultraviolet light. Line widths substantially less than 1 μm require x-rays. Accordingly, x-ray lithography is an active field of research at present.

The speed with which a lithographic exposure can be made (and consequently the thruput) depends upon the intensity of the actinic radiation flooding the mask. Since high thrust is commercially desirable, high brightness x-ray and ultraviolet light sources are of particular interest.

Synchrotrons (electron storage rings) are particularly excellent sources of x-rays and ultraviolet light, but synchrotrons are not readily available and are very expensive. X-ray pulses also have been generated through use of a sliding spark discharge (McCorkle Source). Such a source is described by R. McCorkle et al. in "Physical properties of an electron beam-sliding spark device," 48 Rev. Sci. Instr. 1055 (1977), and also by R. McCorkle et al. in "High Intensity Pulsed Electron Beam Plasma Source," 342 Ann. N.Y. Acad. Sci. 53 (1980) and in "Flash X-ray Microscopy," 205 Sci. 401 (1979), which are all hereby totally incorporated by reference.

Intense pulses of soft x-rays furthermore have been produced from laser heated plasmas. Such a source is described by D. Nagel et al. in "Laser-Plasma Source for Pulsed X-ray Lithography," SPIE Vol. 135, Developments in Semiconductor Microlithography III, pp. 46–53 (1978), and again by D. Nagel at al. in "Submicrosecond X-ray Lithography," 14 Elect. Lett. 781 (1978), and also by D. Nagel et al. in "Lithography and High-Resolution Radiography with Pulsed X-rays," 17 Jap. Jour. Appl. Phys. 472 (1978), all of which are hereby totally incorporated by reference.

More recently, an imploding gas jet plasma has been used to generate a pulse of soft x-rays suitable for x-ray lithography. Such a source is described by C. Stallings et al. in "Imploding Argon Plasma Experiments," 35 Appl. Phys. Lett. 524 (1979), and by J. Pearlman et al. in "X-ray Lithography Using a Pulsed Plasma Source," Proc. of the Conf. on Electron, Ion & Photon Beam Sci. & Technol. (Dallas, May 1981), both of which are hereby totally incorporated by reference. The latter reference points out that the same source produces a very intense pulse of extreme (i.e., deep) ultraviolet light.

Intense pulses of ultraviolet light also may be produced by laser bombardment of a target. Such a source is described, for example, by J. A. R. Samson in "Techniques of Vacuum Ultraviolet Spectroscopy," (John Wiley & Sons, 1967, New York.), which is hereby totally incorporated by reference.

Intense pulsed sources of electromagnetic radiation (both x-ray and ultraviolet) tend to simultaneously discharge physical debris such as hot ionized gases and/or particles. Physical debris is undesirable because it contaminates and/or damages optical components and/or the target, such as a lithographic mask.

One known technique for blocking discharge of physical debris is to pass the electromagnetic radiation pulse through a window which transmits the electromagnetic radiation and blocks the physical debris. The window itself must be sufficiently durable to withstand impact of the debris. For electromagnetic radiation above about 2000 Å in wavelength or below about 1 Å in wavelength, practical window materials exist, such as quartz. However, for electromagnetic radiation between about 2000 Å and 1 Å in wavelength, practical window materials are not known to exist. Known durable window materials are not sufficiently transparent to electromagnetic radiation within this range while window materials which are sufficiently transparent within a portion of this range are not very durable and thus must be replaced very frequently. Accordingly, within the range of about 2000 Å to about 1 Å, it is not commercially practical to block the debris with a window while simultaneously maintaining the maximum thruput. Unfortunately, this is precisely the range in which high resolution microcircuit lithography is contemplated because suitable resist materials are not available below this range and high resolution is sacrificed above this range.

SUMMARY OF THE INVENTION

Accordingly, an object of this invention is to provide a high intensity pulsed electromagnetic radiation source within the wavelength range of about 2000 Å to about 1 Å at reasonable cost and without accompanying physical debris.

It is another object to provide a physical barrier for discharged debris which does not block or reduce the intensity of an electromagnetic radiation pulse and is durable and commercially practical.

These and other objects and advantages are achieved by my invention which provides a physical barrier for debris discharged from any pulsed electromagnetic radiation source. A shutter is positioned in the path of the electromagnetic radiation at a distance sufficiently far from the source of the electromagnetic radiation such that an emitted pulse of electromagnetic radiation and the debris simultaneously discharged with the pulse become spatially separated from each other and arrive at the shutter at different times due to the inherent difference in propagation speeds of the debris and of the pulse. Movement of the shutter is synchronized with generation of an electromagnetic pulse such that the electromagnetic pulse encounters an open shutter while the slower travelling debris simultaneously launched with the pulse encounters a closed shutter.

DETAILED DESCRIPTION OF THE INVENTION

Figure 1:
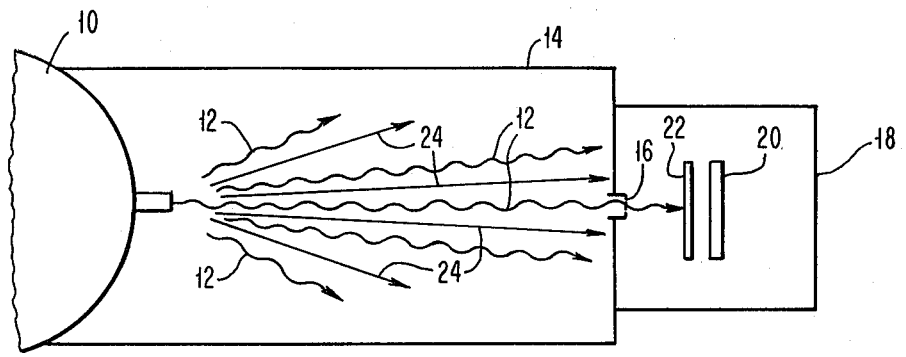
FIG. 1 is a schematic representation of a prior art pulsed electromagnetic radiation source exposing a microcircuit workpiece through a patterned mask.

FIG. 1 illustrates conventional prior art lithography apparatus for exposure in the 2000 Å to 1 Å range. An electromagnetic radiation source 10 emits electromagnetic radiation 12 into vacuum chamber 14. At the other end of chamber 14, electromagnetic radiation passes through window 16 into lithography chamber 18 and exposes a microcircuit wafer 20 through mask 22. If source 10 is an intense pulsed source, then typically source 10 also emits debris 24. Window 16 separates the atmosphere within the lithography chamber (typically helium) from the vacuum environment in chamber 14 and also protects the lithography mask 22 and wafer 20 from the debris 24.

As previously described, materials for window 16 which do pass electromagnetic radiation within this 2000 Å to 1 Å region (at best a portion of this region) are quickly eroded by the debris 24 and must be replaced. A wavelength region of particular interest today is the region of about 6 Å to about 25 Å, because resist materials are being developed which are sensitive in this range. Intense x-ray pulses can be generated within this range by pulsed plasma sources of the type described in the previously cited references. Beryllium windows pass x-rays in this range but are quickly eroded by debris emitted by the pulsed plasma sources and must be frequently replaced.

Figure 2:
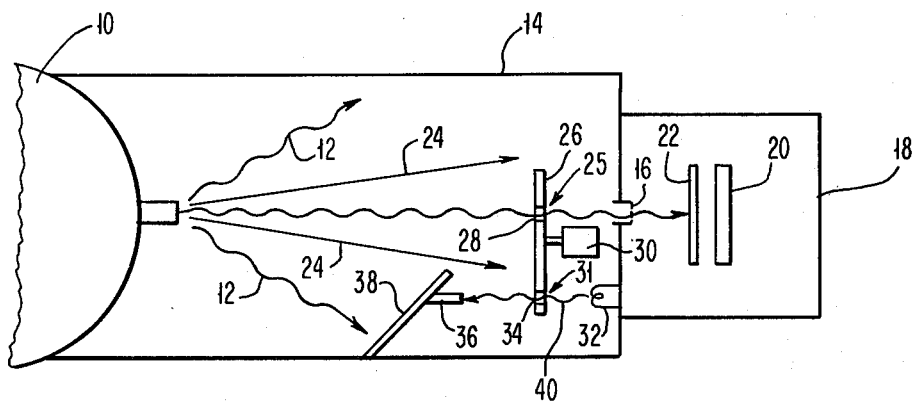
FIG. 2 is a schematic representation of the apparatus of FIG. 1 incorporating my barrier for discharged debris.

In FIG. 2 my barrier for discharged debris is added to the prior art apparatus of FIG. 1. Similar parts are similarly identified by the same reference numbers. A shutter 25 is positioned between source 10 and window 16 to selectively shield window 16 from the debris 24. In the embodiment shown in FIG. 2, shutter 25 comprises a rotatable disk having an aperture 28. The disk can be rotated to a position (shown) such that electromagnetic radiation from source 10 can pass through aperture 28 and window 16 to expose wafer 20 through mask 22. At other rotary positions for the disk (not shown), aperture 28 and window 16 are not aligned with each other so that radiation or debris passing through the aperture 28 when the disk is in one of such other positions does not strike window 16. Disk 26 itself shields window 16 from both radiation and debris except when rotated to a position such that aperture 28 is in alignment with window 16.

According to my invention, disk 26 is rotated to a position such that aperture 28 is aligned with window 16 when an electromagnetic radiation pulse arrives at the disk and is rotated to a position such that aperture 28 is not aligned with window 16 when debris arrives at the disk. This is possible because electromagnetic radiation travels at about 300,000 meters per second while debris launched from a pulsed source travels at about 250 meters per second. Thus, an electromagnetic pulse and the debris simultaneously launched by the source quickly become separated from each other in space due to this difference in propagation speeds. In accordance with my invention, disk 26 is positioned sufficiently far from source 10 such that the electromagnetic pulse and the simultaneously launched debris arrive at the disk at times sufficiently different that the disk can be rotated from an aligned position to an unaligned position in between.

Since the electromagnetic radiation pulse travels very fast (virtually instantaneously), the disk is first positioned such that the aperture is aligned with the window (or the portion of window material to be used, herein merely called the window) and then source 10 is pulsed. After source 10 is pulsed the disk is rotated such that the aperture and the window are not aligned. While it is possible to have the disk stationary (i.e., not rotating) when source 10 is pulsed and still be able to rotate the disk sufficiently to achieve misalignment before the debris shock wave arrives, this would require more expensive and possibly more complicated mechanical apparatus than to have the disk in motion before, during, and after the pulsing of source 10. Accordingly, in my preferred embodiment the disk is brought to a predetermined substantially constant rotary speed by motor 30 before source 10 is pulsed.

Synchronization of the source pulsing and disk rotation is preferably accomplished by optically sensing a timing mark 31 located on the disk 26. In FIG. 2 a light source 32 is positioned on one side of the disk opposite a timing aperture 34. On the other side a photodiode 36 is positioned by shield 38 to receive light 40 coming from source 32 through timing aperture 34. If there is no time delay between the triggering of photodiode 36 by timing aperture 34 and actual emission of an electromagnetic radiation pulse by source 10, then the timing aperture 34 is positioned such that light 40 reaches photodiode 36 at the same time as aperture 28 becomes aligned with window 16. If a significant time delay occurs between triggering of photodiode 36 by timing aperture 34 and actual arrival of the electromagnetic pulse, at aperture 28, then the timing aperture must be correspondingly advanced with respect to aperture 28.

Figure 3:
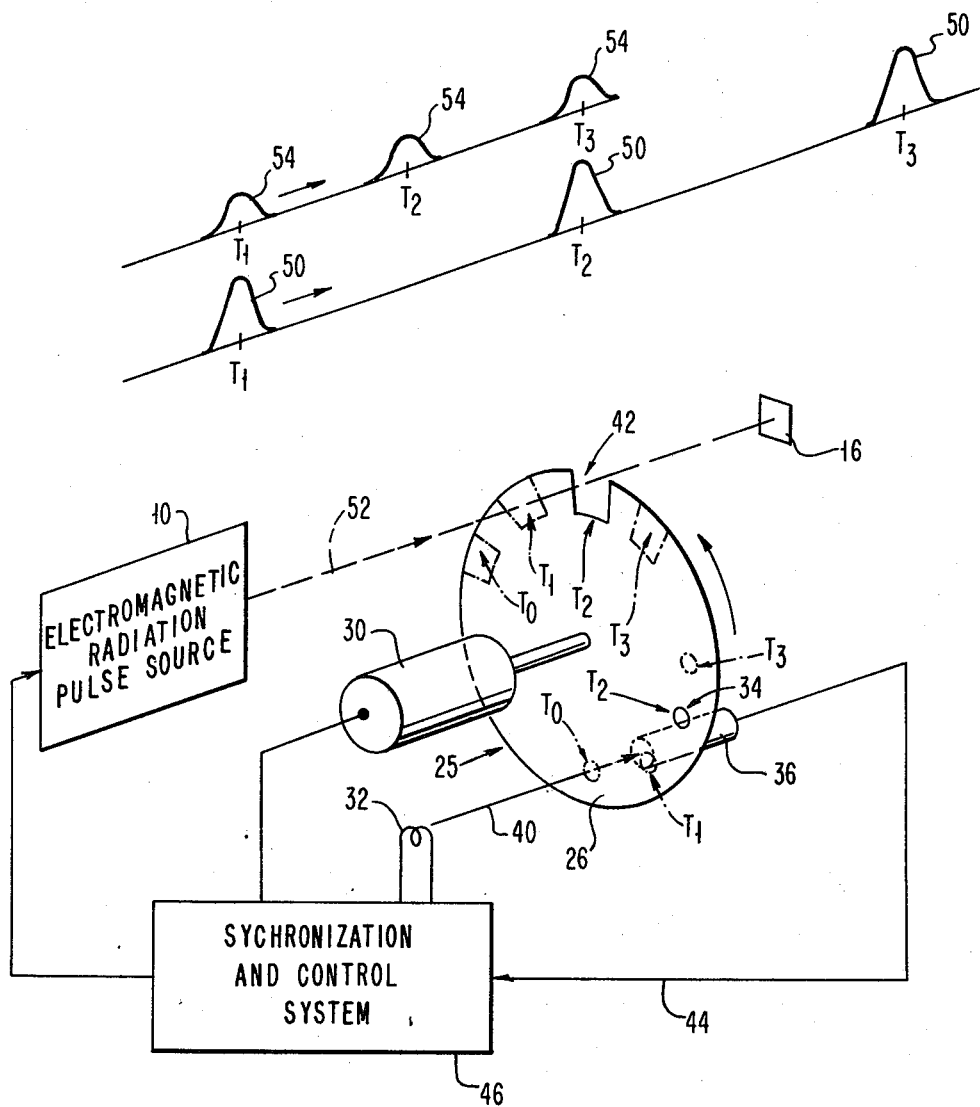
FIG. 3 illustrates synchronization of the barrier shutter with generation of an electromagnetic radiation pulse.

FIG. 3 illustrates synchronization of barrier shutter 25 with generation of an electromagnetic radiation pulse. In this illustration, a rectangular notch 42 located along the edge of disk 26 replaces aperture 28. For the purpose of explaining timing relationships, the propagation speed of the electromagnetic wave is illustrated as twice the propagation speed of the debris and triggering of source 10 has an illustrated time delay.

Motor 30 first brings disk 26 to a substantially constant speed $\omega$. When disk 26 has rotated to a position where light 40 from source 32 can pass through aperture 34 and reach photodiode 36 (time $T_0$), a signal is transmitted along line 44 to the synchronization and control system 46. Control system 46 triggers release of an electromagnetic wave from source 10 at time $T_1$ (which may or may not be substantially simultaneous with time $T_0$). Simultaneously a debris wave 54 is launched. For purpose of illustration these two waves 50, 54 are shown travelling along separate axes parallel with path 52. It should be understood that they are both actually travelling along path 52 instead. At time $T_2$, the electromagnetic pulse 50 has reached shutter 25 and encounters opening 42. The FIG. 3 illustration depicts this moment and shows a rotation of disk 26 sufficient that aperture 34 no longer is aligned with photodiode 36 and source 32. In reality, pulse 50 may arrive at disk 26 so quickly that disk 26 has not perceptively rotated.

FIG. 3 illustrates that at time $T_2$, when the electromagnetic wave 50 passes through opening 42, the debris wave 54 has not yet reached shutter 25. For illustration, wave 54 is shown as having travelled halfway to the shutter 25. In reality, wave 54 is much farther behind wave 50 and has in fact travelled less than 0.1 percent of the distance that wave 50 has travelled. At time $T_3$, debris wave 54 reaches shutter 25, but by this time disk 26 has rotated such that opening 42 now has the position 48 illustrated in phantom. Electromagnetic wave 50 has by this time passed through window 16.

Figure 4:
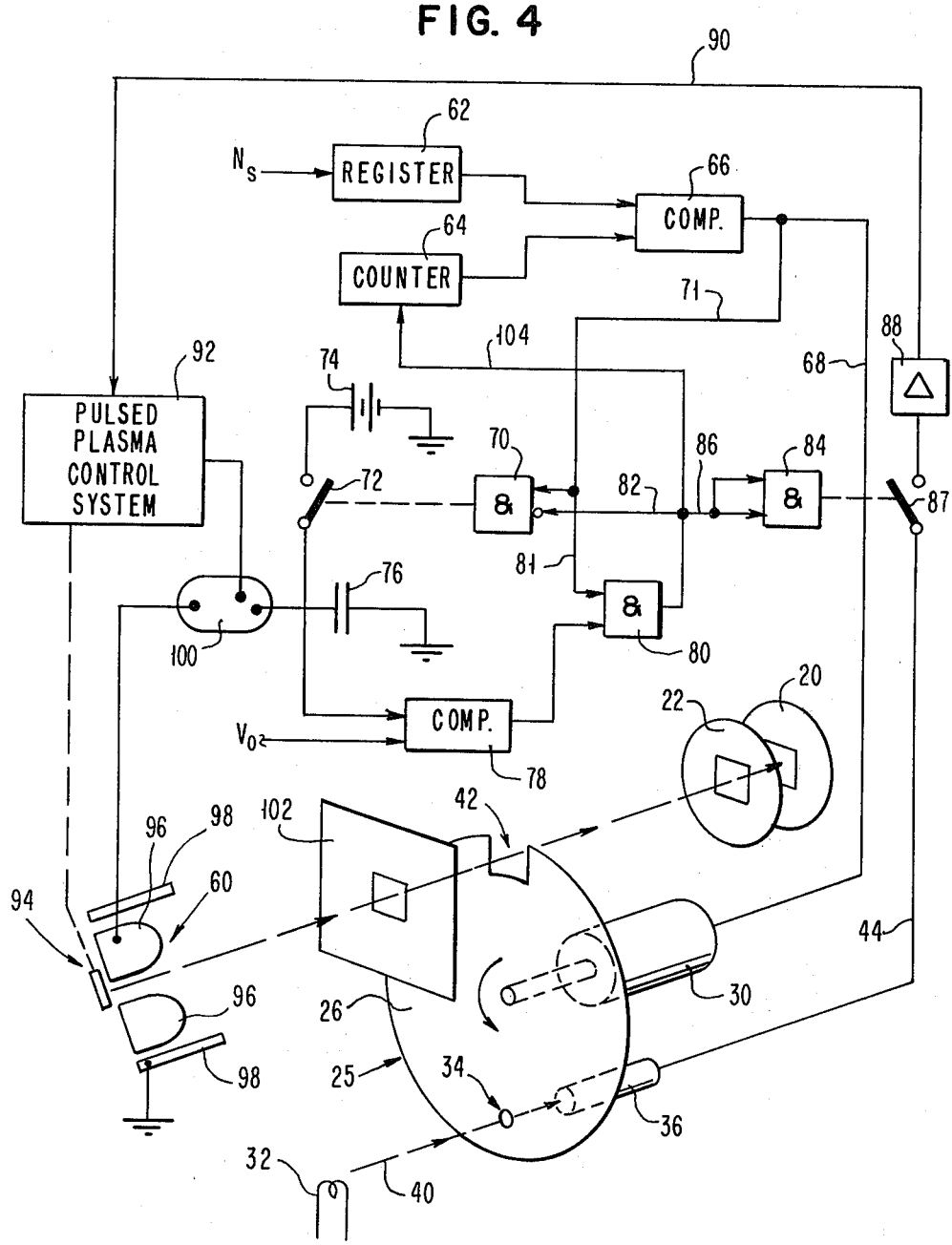
FIG. 4 is a detailed schematic diagram of synchronization and control circuitry for practical embodiment of my invention.

FIG. 4 is a schematic diagram of control circuitry 46 useful for implementing my invention with a pulsed plasma source 60. Register 62 is set to the number of pulses or shots desired, $N_s$. Counter 64 keeps track of the number of pulses emitted by plasma source 60. If the number of pulses already emitted (contained in counter 64) is less than the number desired (held by register 62), then comparator 66 starts motor 30 (or keeps it going) via line 68. Simultaneously, gate 70 is switched via line 71 and closes switch 72 so that voltage source 74 begins to charge capacitor bank 76. When capacitor bank 76 is charged to voltage $V_0$, comparator 78 enables gate 80. If another pulse is desired (as indicated by a signal on line 81 from comparator 66), gate 80 becomes switched and disables gate 70 via line 82. Gate 70 opens switch 72 since capacitor bank 76 has now been charged to $V_0$. Simultaneously gate 84 is switched by gate 80 via line 86. Gate 84 closes switch 87 which connects photodiode 36 to amplifier 88 via line 44. As soon as timing aperture 34 reaches the correct position, light 40 from source 32 reaches photodiode 36 and causes a signal to be sent via amplifier 88 and line 90 to the pushed plasma control system 92.

Control system 92 causes a puff valve 94 to open briefly so that a small quantity of gas briefly fills the space between electrodes 96, 98. In rapid succession, system 92 then causes the gas to become ionized with microwave energy (not shown) and capacitor bank 76 is discharged across electrodes 96,98 by spark gap switch 100.

Particular details of such pulsed plasma sources do not form a part of my invention. Further detailed information regarding such pulsed plasma sources and control thereof is available however from the previously cited references and parts and components for such sources as well as detailed operational information may also be obtained from companies which fabricate and sell such sources, such as: Maxwell Laboratories, Inc., 8835 Balboa Ave. San Diego, CA. 92123, and Physics International Company, 2700 Merced Street, San Leandro, CA 94577.

As a result of the discharge of capacitor bank 76 across electrodes 96, 98, a pulse of electromagnetic radiation and a shock wave of debris (mostly hot gases) are launched towards mask 22 and wafer 20. Notch 42 passes the electromagnetic wave but is rotated to the left by the time the shock wave of debris arrives. As shown in FIG. 4 an additional shield 102 may be used ahead of the shutter 25 to protect the shutter and to limit the region hit by the pulse waves. The region hit by the pulses is limited as much as practical so that the notch 42 needs to move only a small distance before misalignment occurs. If only a small movement is needed, the rotational speed of disk 26 can be lowered. For example, if disk 26 is 50 cm in radius and spaced from source 60 by 25 cm, and notch 42 is about 2 cm by 2 cm, the rotational speed of disk 26 can be as low as about 6 revolutions per second with a suitable shield 102.

Discharge of capacitor bank 76 is sensed by comparator 78, which in turn disables gate 80. Counter 64 increments by one count via line 104 when the output of gate 80 drops. Simultaneously, gate 70 is enabled via line 82 for another shot (pulse) and gate 84 is opened via line 86, thereby opening switch 87. If the count in counter 64 is still less than the count $N_s$ in register 62, comparator 66 automatically initiates another shot.

It should be apparent that many portions of the disk do not function actually to shield window 16 from debris and that the only part of the disk which is actually necessary from a functional standpoint is the small part which actually does lie between the source 10 and the window 16 when the debris strikes the disk. Thus many other constructions for shutter 25 are possible. For example, the shutter might be a rectangular plate which is linearly translated or reciprocated. Variations are similarly apparent with respect to construction of a timing mark 31. For example, timing may be triggered mechanically rather than by optically or otherwise sensing a mark. Although my preferred embodiment is described in connection with its use with an imploding gas jet plasma source, it should be apparent that the same shutter could be used instead with a spark discharge source or with a source which generates the electromagnetic pulse by laser beam impact with a target. Also, while my preferred ranges for the radiation are 6 Å to 25 Å and 600 Å to 2000 Å, corresponding to the microcircuit lithography ranges of current interest, it should be apparent that my debris barrier might find use in other wavelength regions as well, expecially within the range where practical windows are not available, namely 2000 Å to 1 Å. Further variations and modifications would also be apparent to one of ordinary skill.

Having thus described my invention, what I claim as new, and desire to secure by Letters Patent is:

1. A pulsed electromagnetic radiation source of the type wherein the generation of an electromagnetic radiation pulse also simultaneously discharges physical debris in the radiated direction, the improvement comprising:

a shutter located in the path of the electromagnetic radiation and sufficiently far from the source of said radiation such that a pulse of electromagnetic radiation and the simultaneousely discharged debris arrive at said shutter at different times due to an inherent difference in propagation velocity; and means for synchronizing generation of an electromagnetic radiation pulse with movement of said shutter such that said shutter is open when the electromagnetic pulse arrives at said shutter and thereby passes said electromagnetic radiation pulse and is closed when the simultaneously discharged debris arrives at said shutter and thereby blocks propagation of said debris.

2. A pulsed electromagnetic radiation source as defined in claim 1 wherein the wavelength of generated electromagnetic radiation is within the range of from about 1 Angstrom to about 2000 Angstroms.

3. A pulsed electromagnetic radiation source as defined in claim 2 wherein the wavelength of generated electromagnetic radiation is within the microcircuit lithography x-ray range of about 6 Angstroms to about 24 Angstroms.

4. A pulsed electromagnetic radiation source as defined in claim 2 wherein the wavelength of generated electromagnetic radiation is within the microcircuit lithography ultraviolet range of about 600 Angstroms to about 2000 Angstroms.

5. A pulsed electromagnetic radiation source as defined in claim 1 wherein the electromagnetic radiation is generated by a plasma.

6. A pulsed electromagnetic radiation source as defined in claim 1 wherein the electromagnetic radiation is generated by laser beam impact with a target surface.

7. A pulsed electromagnetic radiation source as defined in claim 1 wherein the electromagnetic radiation is generated by a spark discharge through a gas.

8. A pulsed electromagnetic radiation source as defined in claim 1 wherein said shutter comprises a rotatable disk having at least one opening therein for passing electromagnetic radiation.

9. A pulsed electromgnetic radiation source as defined in claim 8 wherein said opening is a rectangular notch at the edge of said disk.

10. A pulsed electromagnetic radiation source as defined in claim 8 wherein said disk carries a timing mark for synchronizing the generation of an electromagnetic radiation pulse with said disk as said disk rotates.

11. A pulsed electromagnetic radiation source as defined in claim 10 wherein said timing mark is an aperture, a light beam being passed by said aperture to a detector when said aperture is in a predefined position.

12. A barrier for debris discharged from a pulsed electromagnetic radiation source, comprising:
   a shutter located in the path of the electromagnetic radiation and sufficiently far from the source of said radiation such that a pulse of electromagnetic radiation and simultaneously discharged debris become separated from each other and arrive at said shutter at different times due to an inherent difference in propagation speed; and
   means for synchronizing generation of an electromagnetic radiation pulse with movement of said shutter such that said shutter is open when the electromagnetic pulse arrives at said shutter, said shutter thereby passing said electromagnetic radiation pulse and said shutter is closed when the simultaneously discharged debris arrives at said shutter, said shutter thereby blocking propagation of said debris.

13. Microcircuit lithography apparatus of the type wherein a microcircuit wafer may be exposed through an adjacent mask to electromagnetic radiation coming from a pulsed source, the improvement comprising a barrier for debris discharged from the pulsed electromagnetic radiation source, said barrier comprising:
   a shutter located between the electromagnetic radiation source and the mask and sufficiently far from the source of said radiation such that a pulse of electromagnetic radiation and simultaneously discharged debris become separated from each other and arrive at said shutter at different times due to an inherent difference in propagation speed; and
   means for synchronizing generation of an electromagnetic radiation pulse with movement of said shutter such that said shutter is open when the electromagnetic pulse arrives at said shutter, said shutter thereby passing said electromagnetic radiation pulse to said mask and said shutter is closed when the simultaneously discharged debris arrives at said shutter, said shutter thereby blocking propagation of said debris to said mask.

* * * * *